(12) United States Patent
Hoshi

(10) Patent No.: US 7,212,286 B2
(45) Date of Patent: May 1, 2007

(54) ALIGNING METHOD, EXPOSURE METHOD, EXPOSURE APPARATUS, AND DEVICE MANUFACTURING METHOD

(75) Inventor: Tai Hoshi, Tokyo (JP)

(73) Assignee: Canon Kabushiki Kaisha, Tokyo (JP)

( * ) Notice: Subject to any disclaimer, the term of this patent is extended or adjusted under 35 U.S.C. 154(b) by 133 days.

(21) Appl. No.: 10/178,234

(22) Filed: Jun. 25, 2002

(65) Prior Publication Data
US 2003/0003384 A1  Jan. 2, 2003

(30) Foreign Application Priority Data
Jun. 29, 2001  (JP) .............................. 2001-198744

(51) Int. Cl.
G01B 11/00 (2006.01)
G03B 27/42 (2006.01)
C09K 19/00 (2006.01)
G02F 1/03 (2006.01)

(52) U.S. Cl. ........................... 356/401; 355/53; 430/22

(58) Field of Classification Search ........ 356/399–401; 430/5, 22, 30; 250/548, 559.29, 559.3; 355/53, 355/55
See application file for complete search history.

(56) References Cited

U.S. PATENT DOCUMENTS

| | | | | |
|---|---|---|---|---|
| 4,566,795 A | * | 1/1986 | Matsuura et al. ........... 356/400 |
| 4,780,617 A | * | 10/1988 | Umatate et al. ............. 250/548 |
| 4,962,318 A | * | 10/1990 | Nishi ......................... 250/548 |
| 5,695,897 A | * | 12/1997 | Mitome et al. ............... 430/22 |
| 5,805,866 A | * | 9/1998 | Magome et al. .............. 716/19 |
| 6,342,703 B1 | * | 1/2002 | Koga et al. .................. 250/548 |
| 6,399,283 B1 | | 6/2002 | Hoshi ......................... 430/312 |
| 6,481,003 B1 | * | 11/2002 | Maeda ........................ 716/21 |
| 6,587,201 B2 | * | 7/2003 | Nishi ......................... 356/401 |
| 6,876,946 B2 | * | 4/2005 | Yasuda et al. .............. 702/152 |
| 6,885,908 B2 | * | 4/2005 | Yoshida et al. ............. 700/191 |
| 2002/0042664 A1 | * | 4/2002 | Kikuchi ...................... 700/114 |

FOREIGN PATENT DOCUMENTS

JP  63-232324  9/1988
JP  63-232325  9/1988

* cited by examiner

*Primary Examiner*—Layla G. Lauchman
*Assistant Examiner*—Gordon J. Stock, Jr.
(74) *Attorney, Agent, or Firm*—Fitzpatrick, Cella, Harper & Scinto

(57) ABSTRACT

A method of selecting alignment marks, to be detected, from a plurality of alignment marks formed on a substrate includes the step of calculating a deviation between a distance of a designed position of an alignment mark from a reference position and a reference value, with respect to each of the plurality of alignment marks. The alignment marks, to be detected, are selected based on the deviations.

10 Claims, 11 Drawing Sheets

FIG. 11
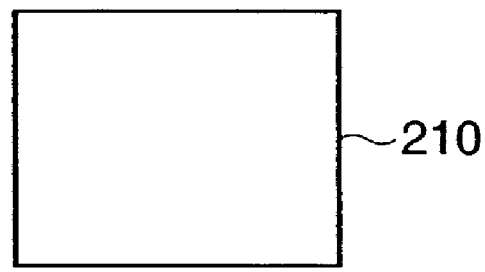
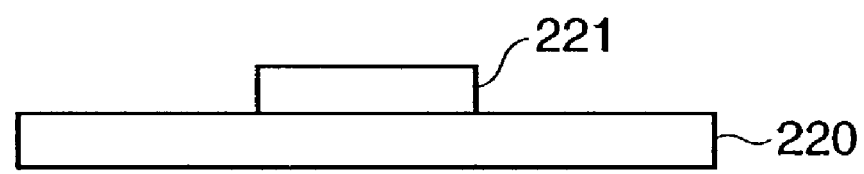
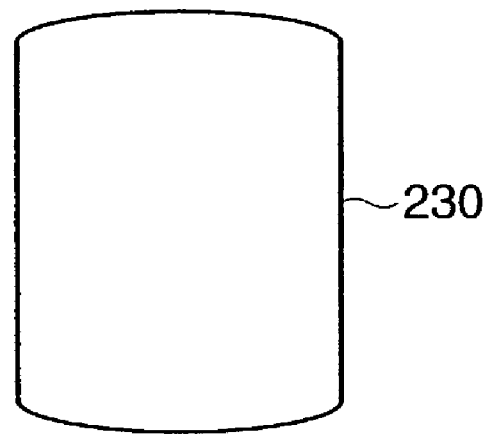
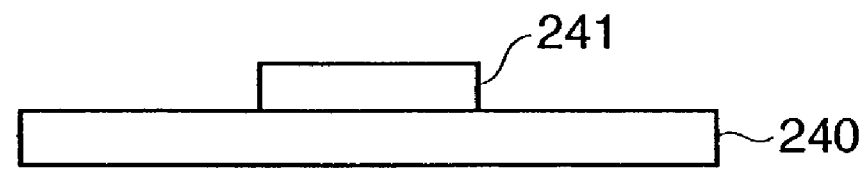

ALIGNING METHOD, EXPOSURE METHOD, EXPOSURE APPARATUS, AND DEVICE MANUFACTURING METHOD

FIELD OF THE INVENTION

The present invention relates to an aligning method, an exposure method, and an exposure apparatus used for manufacturing various types of devices, e.g., a semiconductor element such as an IC or LSI, a display element such as a liquid crystal panel, a detection element such as a magnetic head, and an image sensing element such as a CCD, and a device manufacturing method.

BACKGROUND OF THE INVENTION

For example, in a photolithography process for manufacturing a semiconductor element, and the like, an exposure apparatus for transferring a pattern on a master (mask or reticle) onto a substrate (wafer or glass plate) coated with a photoresist is used. Recently, a reduction projection exposure apparatus, which is advantageous in terms of resolution and aligning precision, has been used. Usually, a semiconductor element is manufactured by forming multilevel circuit patterns on a plurality of shot regions arrayed on a substrate by using different masters.

A shot array comprised of a plurality of shots arranged on the substrate will be called a shot layout. The shot layout is formed by considering the size of the substrate, the sizes of the shot regions, the sizes of the chip regions, and the like. A necessary number of shots selected from the shot layout in order to overlay circuits for forming the multilevel circuits described above is called sample shots. The sample shots are usually selected automatically. As a sample shot selecting method, methods disclosed in Japanese Patent Laid-Open Nos. 63-232324 and 63-232325 are known. The sample shot selecting method is important in overlay accuracy.

Conventionally, concerning selection of the sample shots, when an arbitrary number of shots is specified, the arbitrary number is arithmetically processed from the shot layout described above on the basis of the central coordinates of the shots arranged in the shot layout. As in the conventional case, when the shot size is comparatively small and the required precision is comparatively small and the required precision is comparatively moderate, the shot center and an alignment measurement mark position, which is used for actual overlaying, can be treated to be identical while causing no problems.

In recent years, the size of the semiconductor element increases, a region (angle of field) that can be exposed by one shot is widened in order to improve the productivity, and a requirement for improving the overlay accuracy has become stricter. Thus, an adverse influence produced by treating the shot center and the alignment measurement mark position to be identical becomes no longer negligible.

Conventionally, measurement marks are arranged for each measurement direction (X and Y directions) (X-direction marks are arranged along a transverse scribing line and Y-direction marks are arranged along a vertical scribing line), so a measurement error is minimized. However, in order to improve the productivity, marks with which the measurement time can be shortened, i.e., measurement marks with which both the X and Y directions can be measured simultaneously, are employed. Also, in order to correct the shot shape, multi-point measurement marks are arranged within the shot. This makes it difficult to improve the precision when sample shot selection is performed in the conventional manner by treating the shot center and the measurement mark position to be identical.

As described above, in conventional sample shot selection for performing overlaying, the arithmetic process is performed on the basis of the shot center. On the shot layout, even if the sample shots can be arranged in the vicinities of positions at an equal distance from the substrate center, when the positions of actual alignment measurement marks arranged in the shot do not correspond to the shot center, the measurement mark positions are deviated from the substrate center.

In fact, the overlaying measurement marks in the shot are rarely arranged at the shot center, and are usually formed in scribing line regions arranged between shots. Even if the centers of selected sample shots can be arranged at the equal distance from the substrate center, for example, the X/Y-direction simultaneous measurement mark positions are displaced form the shot center by half the shot size at minimum. This appears as a deviation amount from the substrate center.

In an ideal state, this deviation amount does not adversely affect the overly accuracy. In fact, however, a measurement error caused depending on the coating uniformity of the resist, and a position detection error such as expansion/contraction of the substrate, which is caused by annealing of the substrate, exist. When these errors exits and the deviation of measurement mark positions from the substrate center is present, an error occurs in a correction amount obtained by a statistical process, to adversely affect the overlay accuracy.

For example, assume that X/Y-direction simultaneous measurement marks are used. When the shot size is 20 mm and a substrate magnification component produced by manufacturing process factors is 5 ppm, a shift component produced by the overlaying measurement value is about 50 nm when compared to a case with no substrate magnification component. This cannot be neglected when compared to a recent required overlay accuracy of 30 nm.

It is known that the measurement error caused depending on the coating uniformity of the resist, and expansion/contraction of the substrate, which is caused by annealing of the substrate, occur radially from the substrate center and equally concentrically due to the manufacturing process. Also, the expansion/contraction in the radial direction varies in accordance with the manufacturing process and the density of the circuit pattern.

In order to decrease an influence on the overlay accuracy caused by the manufacturing process factors, the present invention has as its object to provide an automatic selecting method for alignment measurement sample shots, which is not adversely affected by the shot size.

SUMMARY OF THE INVENTION

The present invention has been proposed to solve the conventional problems, and has as its object to provide an aligning method, an exposure apparatus employing the alignment method, and a device manufacturing method employing the exposure apparatus.

In order to achieve the above object, an aligning method, an exposure apparatus employing the alignment method, and a device manufacturing method employing the exposure apparatus according to the present invention are characterized mainly by the following steps and arrangements.

More specifically, in an aligning method according to the present invention, an aligning method of measuring positions of measurement marks at a plurality of shot positions on a substrate, statistically processing measurement values, and aligning a master and the substrate, wherein when a plurality of measurement marks exist related to a shot, measurement marks to be used for alignment are selected therefrom independently of each other.

In an aligning method according to the present invention, the present invention provides an aligning method of measuring positions of measurement marks at a plurality of shot positions on a substrate, statistically processing measurement values, and aligning a master and the substrate, wherein a necessary number of shots to be used for alignment are selected from a plurality of shots on the substrate on the basis of the shot positions or the positions of the measurement marks.

In an aligning method according to the present invention, the present invention provides an aligning method of measuring positions of measurement marks at a plurality of shot positions on a substrate, statistically processing measurement values, and aligning a master and the substrate, wherein a necessary number of shots to be used for alignment are selected form a plurality of shots on the substrate on the basis of distances between a center of the substrate and the positions of the measurement marks.

In an aligning method according to the present invention, the present invention provides an aligning method of measuring positions of measurement marks at a plurality of shot positions on a substrate, statistically processing measurement values, and aligning a master and the substrate, wherein a necessary number of shots to be used for alignment are selected from a plurality of shots on the substrate so as to be distributed in the vicinities of positions with which distances between a center of the substrate and the positions of the measurement marks are equal.

Preferably, in any one of the above aligning methods, when the necessary number of shots to be used for alignment is selected from the plurality of shots on the substrate, distances between a center of the substrate and the measurement marks are calculated, allowable values of differences in distance between the center of the substrate and the measurement marks are input for all the marks or for each mark, and whether the allowable values are satisfied is checked.

An exposure apparatus according to the present invention comprises an alignment unit for measuring positions of measurement marks at a plurality of shot positions on a substrate, statistically processing measurement values, and aligning a master and the substrate; and a projection exposure unit for projecting and exposing a pattern of the master onto the substrate aligned by the alignment unit, wherein when a plurality of measurement marks exist in a shot, the alignment unit selects measurement marks to be used for alignment therefrom independently of each other.

An exposure apparatus according to the present invention comprises: an alignment unit for measuring positions of measurement marks at a plurality of shot positions on a substrate, statistically processing measurement values, and aligning a master and the substrate; and a projection exposure unit for projecting and exposing a pattern of the master onto the substrate aligned by the alignment unit, wherein the alignment unit selects a necessary number of shots to be used for alignment from a plurality of shots on the wafer on the basis of the shot positions or the positions of the measurement marks.

An exposure apparatus according to the present invention comprises: an alignment unit for measuring positions of measurement marks at a plurality of shot positions on a substrate, statistically processing measurement values, and aligning a master and the substrate; and a projection exposure unit for projecting and exposing a pattern of the master onto the substrate aligned by the alignment unit, wherein the alignment unit selects a necessary number of shots to be used for alignment from a plurality of shots on the wafer on the basis of distances between a center of the substrate and the positions of the measurement marks.

An exposure apparatus according to the present invention comprises: an alignment unit for measuring positions of measurement marks at a plurality of shot positions on a substrate, statistically processing measurement values, and aligning a master and the substrate; and a projection exposure unit for projecting and exposing a pattern of the master onto the substrate aligned by the alignment unit, wherein the alignment unit selects a necessary number of shots to be used for alignment from a plurality of shots on the wafer so as to be distribution in the vicinities of positions with which distances between a center of the substrate and the positions of the measurement marks are equal.

An exposure method according to the present invention comprises: the aligning step of measuring positions of measurement marks at a plurality of shot positions on a substrate, statistically processing measurement values, and aligning a master and the substrate; and the projecting and exposing step of projecting and exposing a pattern of the master onto the substrate aligned in the aligning step, wherein when a plurality of measurement marks exist in a shot, measurement marks to be used for alignment are selected therefrom independently of each other in the aligning step.

An exposure method according to the present invention comprises: the aligning step of measuring positions of measurement marks at a plurality of shot positions on a substrate, statistically processing measurement values, and aligning a master and the substrate; and the projecting and exposing step of projecting and exposing a pattern of the master onto the substrate aligned in the aligning step, wherein in the aligning step, a necessary number of shots to be used for alignment is selected from a plurality of shots on the substrate on the basis of the shot positions or the positions of the measurement marks.

An exposure method according to the present invention comprises: the aligning step of measuring positions of measurement marks at a plurality of shot positions on a substrate, statistically processing measurement values, and aligning a master and the substrate; and the projecting and exposing step of projecting and exposing a pattern of the master onto the substrate aligned in the aligning step, wherein in the aligning step, a necessary number of shots to be used for alignment is selected from a plurality of shots on the substrate on the basis of distances between a center of the substrate and the positions of the measurement marks.

An exposure method according to the present invention comprises: the measuring step of measurement marks at a plurality of shot positions on a substrate, statistically processing measurement values, and aligning a master and the substrate; and the projecting and exposing step of projecting and exposing a pattern of the master onto the substrate aligned in the aligning step, wherein in the aligning step, a necessary number of shots to be used for alignment is selected from a plurality of shots on the substrate so as to be distributed in the vicinities of positions with which distances between a center of the substrate and the positions of the measurement marks are equal.

A device manufacturing method according to the present invention comprises the steps of: installing a plurality of semiconductor manufacturing apparatuses, including an exposure apparatus, at a factory; and manufacturing a semiconductor device by using the plurality of semiconductor manufacturing apparatuses, the exposure apparatus comprising an alignment unit for measuring positions of measurement marks at a plurality of shot positions on a substrate, statistically processing measurement values, and aligning a master and the substrate, and a projection exposure unit for projecting and exposing a pattern of the master onto the substrate aligned by the alignment unit, wherein when a plurality of measurement marks exist in a shot, the alignment unit selects measurement marks to be used for alignment therefrom independently of each other.

A device manufacturing method according to the present invention comprises the steps of: installing a plurality of semiconductor manufacturing apparatuses, including an exposure apparatus, at a factory; and manufacturing a semiconductor device by using the plurality of semiconductor manufacturing apparatuses, the exposure apparatus comprising an alignment unit for measuring positions of measurement marks at a plurality of shot positions on a substrate, statistically processing measurement values, and aligning a master and the substrate, and a projection exposure unit for projecting and exposing a pattern of the master onto the substrate aligned by the alignment unit, wherein the alignment unit selects a necessary number of shots on the wafer on the basis of the shot positions or the positions of the measurement marks.

A device manufacturing method according to the present invention comprises the steps of: installing a plurality of semiconductor manufacturing apparatuses, including an exposure apparatus, at a factory; and manufacturing a semiconductor device by using the plurality of semiconductor manufacturing apparatuses, the exposure apparatus comprising an alignment unit for measuring positions of measurement marks at a plurality of shot positions on a substrate, statistically processing measurement values, and aligning a master and the substrate, and a projection exposure unit for projecting an exposing a pattern of the master onto the substrate aligned by the alignment unit, wherein the alignment unit selects a necessary number of shots to be used for alignment from a plurality of shots on the wafer on the basis of distances between a center of the substrate and the positions of the measurement marks.

A device manufacturing method according to the present invention comprises the steps of: installing a plurality of semiconductor manufacturing apparatuses, including an exposure apparatus, at a factory; and manufacturing a semiconductor device by using the plurality of semiconductor manufacturing apparatuses, the exposure apparatus comprising an alignment unit for measuring positions of measurement marks at a plurality of shot positions on a substrate, statistically processing measurement values, and aligning a master and the substrate, and a projection exposure unit for projecting and exposing a pattern of the master onto the substrate aligned by the alignment unit, wherein the alignment unit selects a necessary number of shots to be used for alignment from a plurality of shots on the wafer so as to be distributed in the vicinities of positions with which distances between a center of the substrate and the positions of the measurement marks are equal.

Other features and advantages of the present invention will be apparent from the following description taken in conjunction with the accompanying drawings, in which like reference characters designate the same or similar parts throughout the figures thereof.

BRIEF DESCRIPTION OF THE DRAWINGS

The accompanying drawings, which are incorporated in and constitute a part of the specification, illustrate embodiments of the invention and, together with the description, serve to explain the principles of the invention.

FIG. 11 is a view showing the schematic arrangement of an exposure apparatus incorporating an alignment unit according to a preferred embodiment of the present invention.

DETAILED DESCRIPTION OF THE PREFERRED EMBODIMENTS

Preferred embodiments of the present invention will now be described in detail in accordance with the accompanying drawings.

Figure 1:
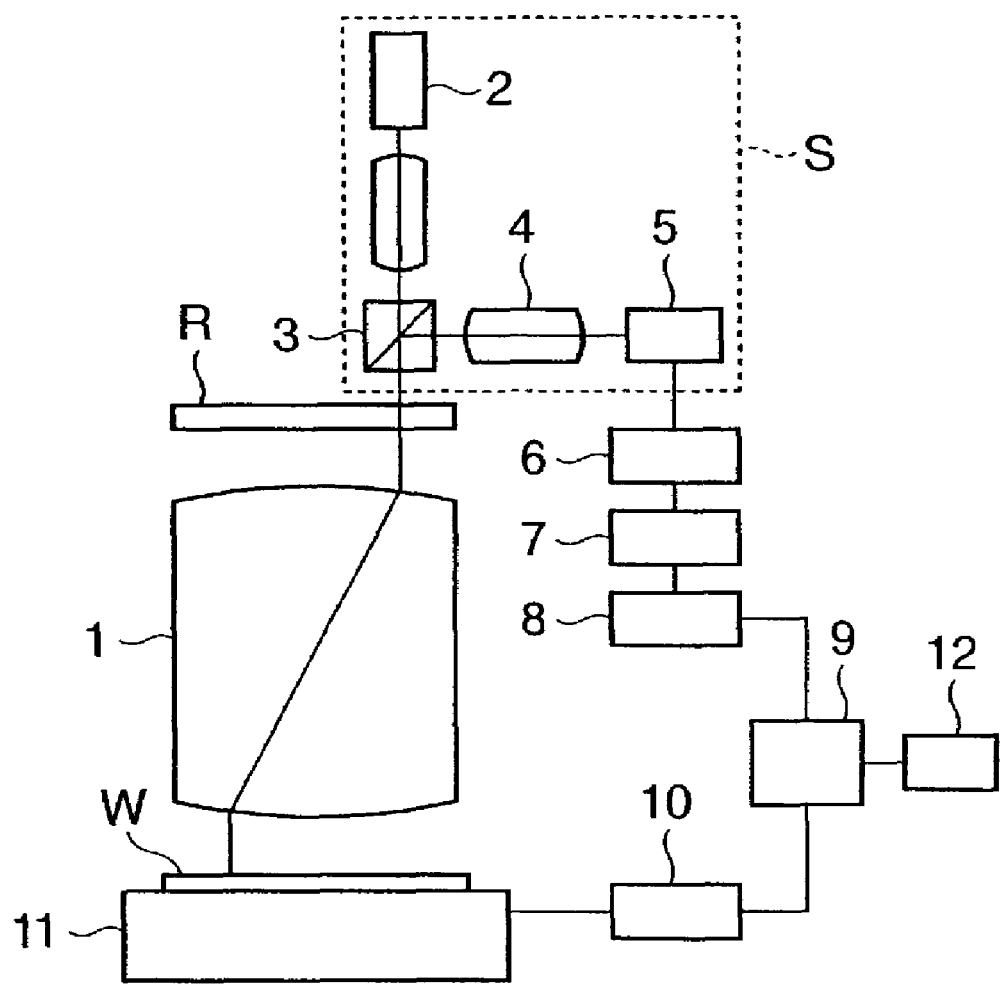
FIG. 1 is a view showing an alignment unit according to an embodiment of the present invention.

FIG. 1 shows an alignment unit according to the present invention. Referring to FIG. 1, reference symbol R denotes a reticle; and W, a wafer. Reference numeral 1 denotes a projection lens, and reference symbol S denotes an alignment optical system. Of the constituent elements of the alignment optical system S, reference numeral 2 denotes an alignment illumination unit; 3, a beam splitter; 4, an alignment scope; and 5, an image sensing device.

Illumination light from the alignment illumination unit 2 irradiates a mark on the wafer W through the beam splitter 3 and projection lens 1. The image of the mark is formed on the image sensing device 5 through the projection lens 1, beam splitter 3, and alignment scope 4. An A/D converter 6 converts an image sensing signal from the image sensing device 5 into a digital signal. The digital signal is accumulated by an accumulator 7 and subjected to position detection by a position detector 8. Position measurement information of the respective marks is statistically processed by a controller 9 and converted into grid information indicating the position, magnification, and rotation of the wafer W as a whole. A stage driver 10 drives an X-Y stage 11 on the basis of this information to move the wafer W. Reference numeral 12 denotes a storage for storing information necessary for the process. A so-called TTL type alignment unit, which detects a mark on the wafer W through the projection lens 1, has been described. Alternatively, an off-axis alignment unit may be used instead.

Figure 2:
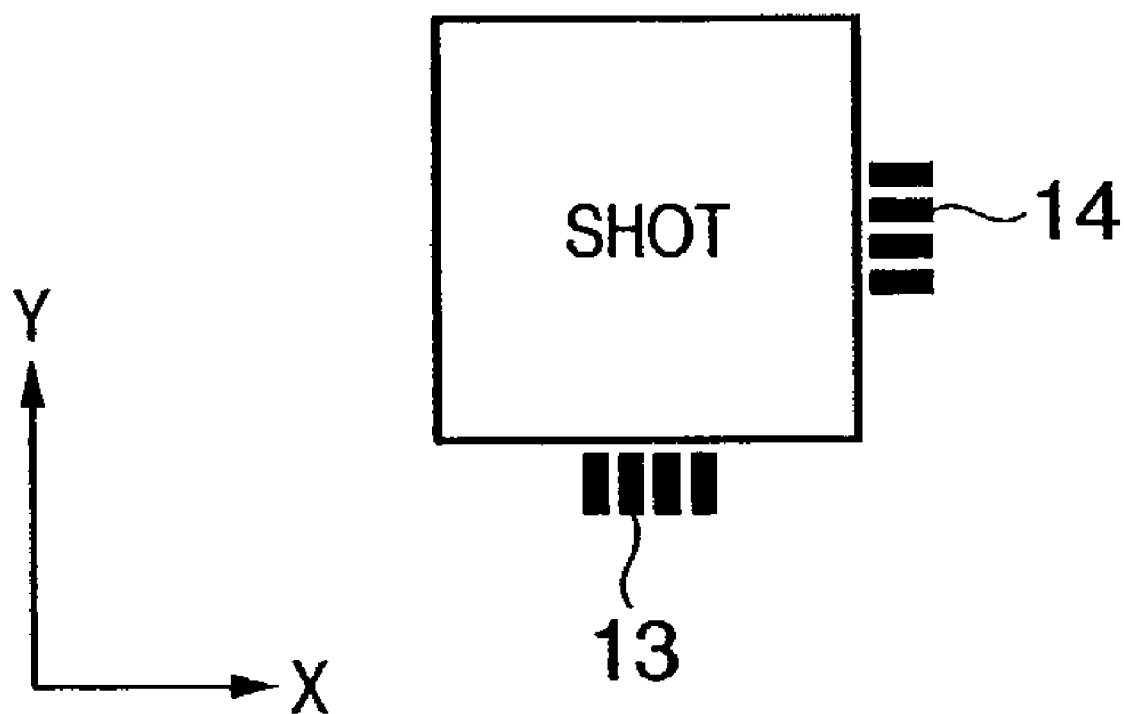
FIG. 2 is a view showing a layout within a shot of measurement marks (X- and Y-directions independent marks)
Figure 3:
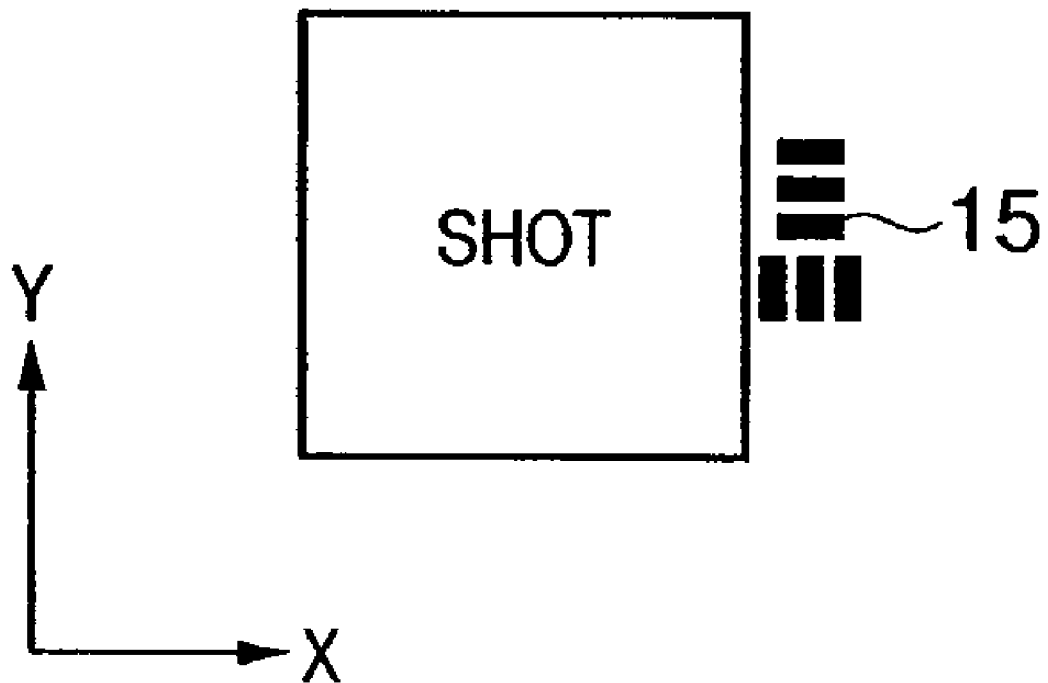
FIG. 3 is a view showing a layout within a shot of measurement marks (X/Y-direction simultaneous measurement marks)

As examples of the layout in the shot according to the present invention, FIG. 2 shows a layout within a shot of X- and Y-direction independent measurement marks, and FIG. 3 shows a layout within a shot of X/Y-direction simultaneous measurement marks. Reference numeral 13 denotes an X-direction measurement mark; 14, a Y-direction measurement mark; and 15, an X/Y-direction simultaneous measurement mark.

Figure 4:
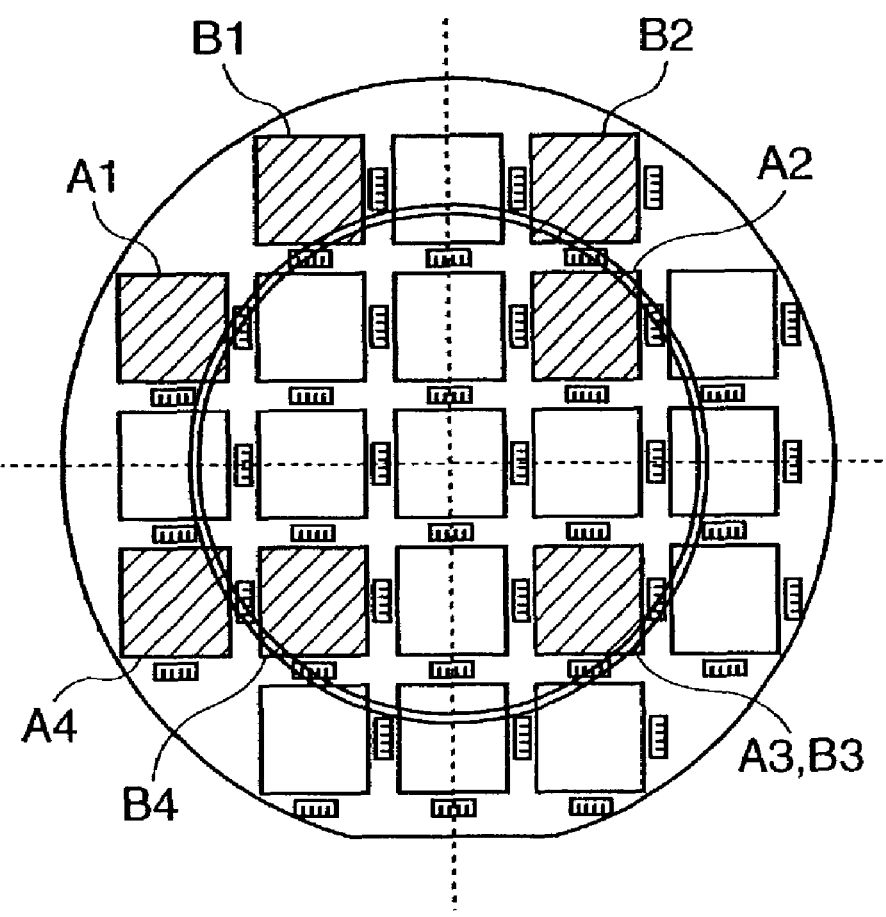
FIG. 4 is a view showing a layout of sample shots for overlaying when the X- and Y-direction independent measurement marks according to the present invention are used.
Figure 9:
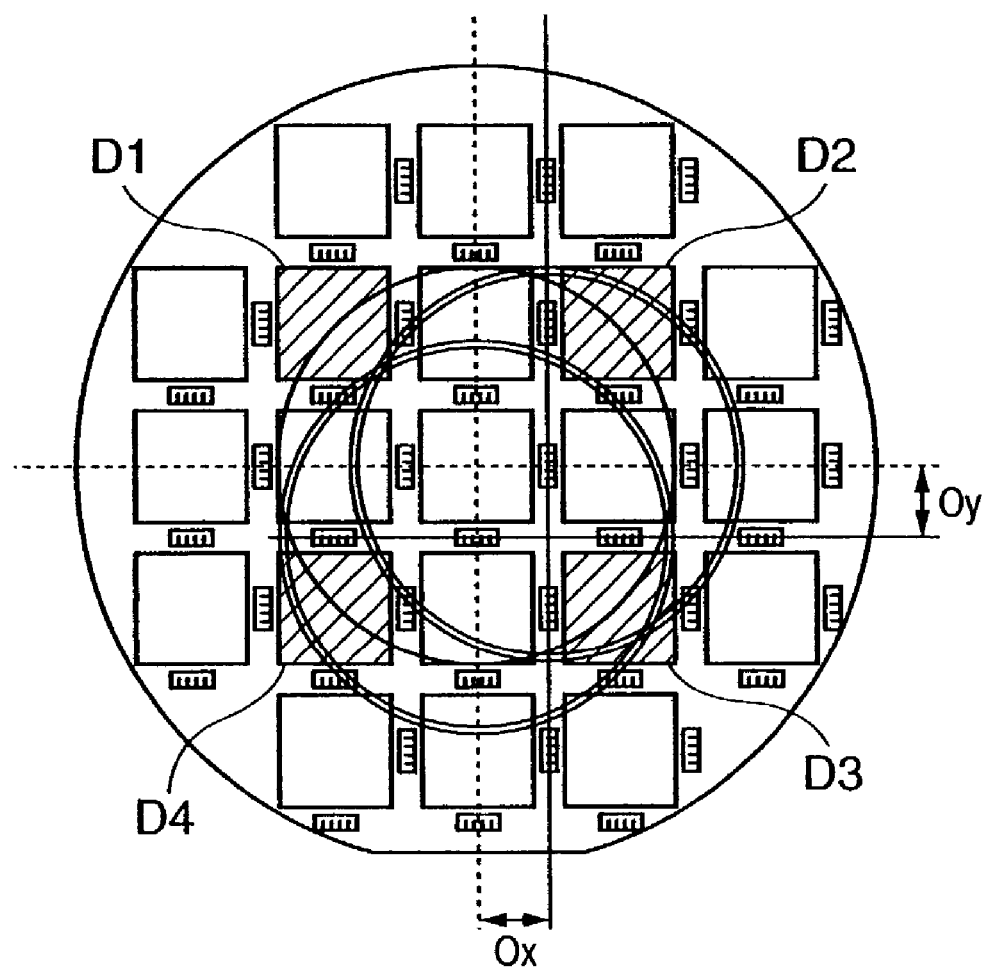
FIG. 9 shows a layout of sample shots for overlaying when conventional X- and Y-direction independent measurement marks are used.

FIG. 9 is a view showing a layout of sample shots for overlaying when conventional X- and Y-direction independent measurement marks are used, and FIG. 4 is a view showing a layout of sample shots for overlaying when the X- and Y-direction independent measurement marks according to the present invention are used.

Figure 5:
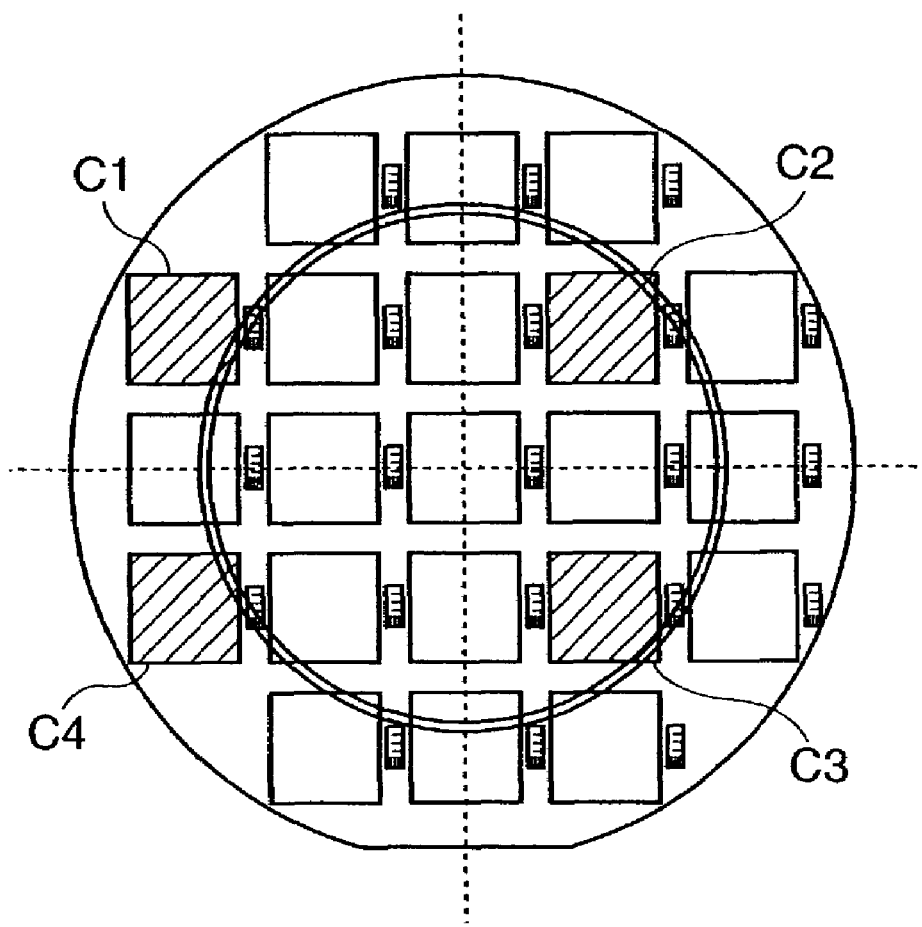
FIG. 5 is a view showing a layout of sample shots for overlaying when the X/Y-direction simultaneous measurement marks according to the present invention are used.
Figure 10:
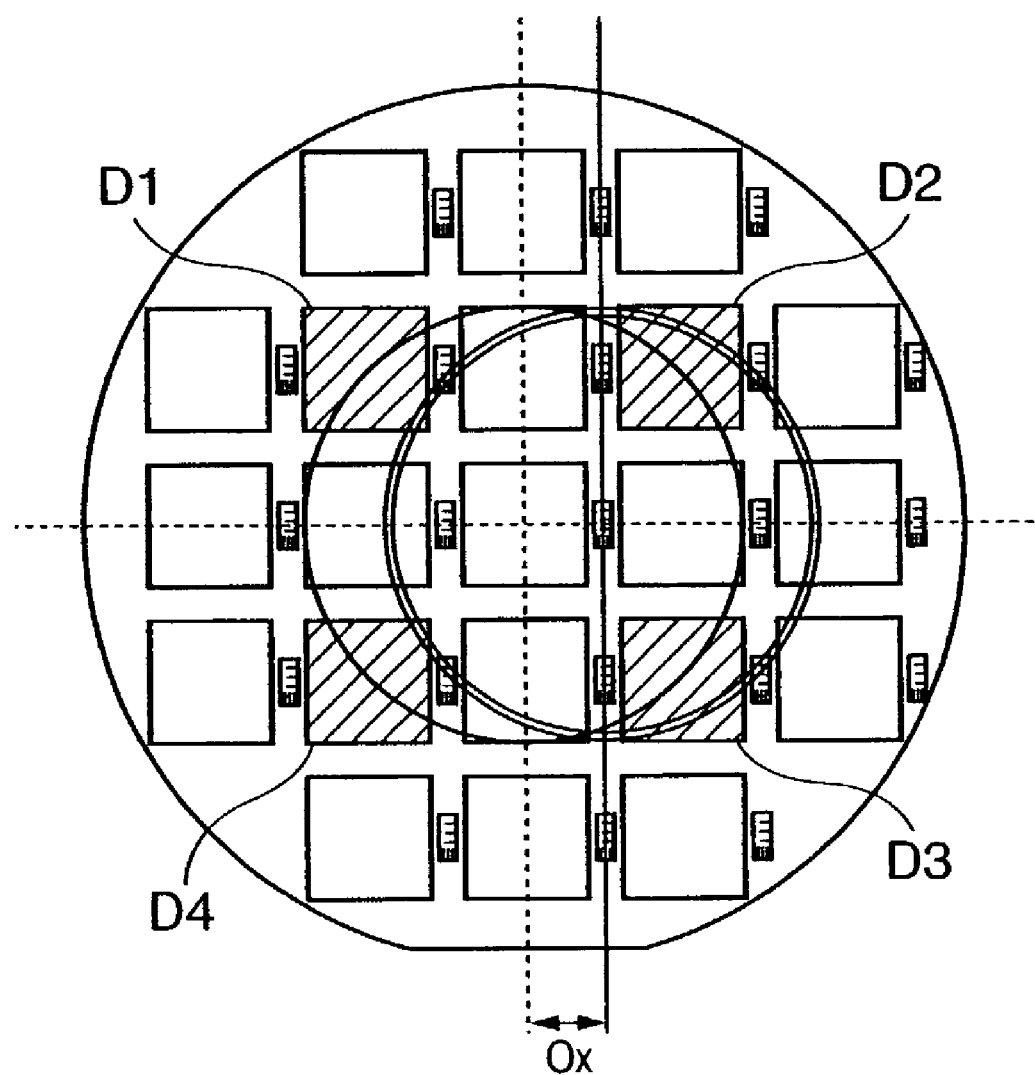
FIG. 10 shows a layout of sample shots for overlaying when conventional X/Y-direction simultaneous measurement marks are used.

FIG. 10 is a view showing a layout of sample shots for overlaying when conventional X/Y-direction simultaneous measurement marks are used, and FIG. 5 is a view showing a layout of sample shots for overlaying when the X/Y-direction simultaneous measurement marks according to the present invention are used.

Referring to FIGS. 9 and 10, reference numerals D1 to D4 denote conventional positions of sample shots. In FIGS. 9 and 10, deviation amounts of a measurement mark from the wafer center are indicated by Ox and Oy. I FIG. 4, reference numerals A1 to A4 denote sample shots for X-direction measurement; and B1 to B4, sample shots for Y-direction measurement. In FIG. 5, reference numerals C1 to C4 denote sample shots for X/Y-direction simultaneous measurement.

The present invention is constituted by the first stage of calculating, when selecting a sample shot, measurement mark position coordinates on the wafer from shot position coordinates and measurement mark position coordinates within a shot, the second stage of selecting a sample shot on the basis of the information on the measurement mark position coordinates on the wafer, and the third stage of checking whether or not the mark position coordinates of the selected shot are within checking information input in advance. These stages will now be described individually.

Regarding calculation of the measurement mark position of the first stage, for example, when the measurement marks arranged in the shot are X- and Y-direction independent marks, the position coordinates of a sample shot candidate or of the measurement marks of all the shots are calculated from the mark layout within the shot down in FIG. 2 and the shot layout within a wafer shown in FIG. 4. The measurement marks are calculated from the shot position coordinates and the measurement mark position coordinates within the shot. When the mark coordinate position within the wafer is directly obtained in advance, its coordinates may be used.

In the second stage, of the measurement mark coordinate positions present within the wafer, those which are in the vicinities of positions at the equal distance from the wafer center are selected, and that shot which has these measurement marks is selected as a sample shot. In the case of FIG. 4, the X- and Y-direction marks are arranged such that their coordinate positions are at the equal distance from the wafer center. In an actual case, however, the shot layout within the wafer, the size of the shot, and the measurement mark position within the shot vary, and it is impossible to arrange all the measurement marks at the equal distance from the wafer center. For this reason, selectable measurement mark coordinate positions are prioritized or conditions such as a measurement mark layout allowable range are added to them, and sample shot selection is performed, so sample shot selection can be performed practically.

The sample shots shown in FIG. 4 are selected completely independently in the X- and Y-directions. When compared to a case wherein X- and Y-direction measurement marks related to one shot are used, different shots are selected for the respective measurement marks. Consequently, a stage driving distance for alignment measurement increases, which may decrease the throughput. In view of this, the middle point between the X and Y mark coordinates may be used as average coordinates for selecting the sample shot in the X and Y direction as the measurement mark coordinates, or as the weighted position of the X and Y coordinates (X and Y barycentric coordinates). Then, sample shot selection more advantageous than a conventional one can be performed without decreasing the throughput.

Figure 6:
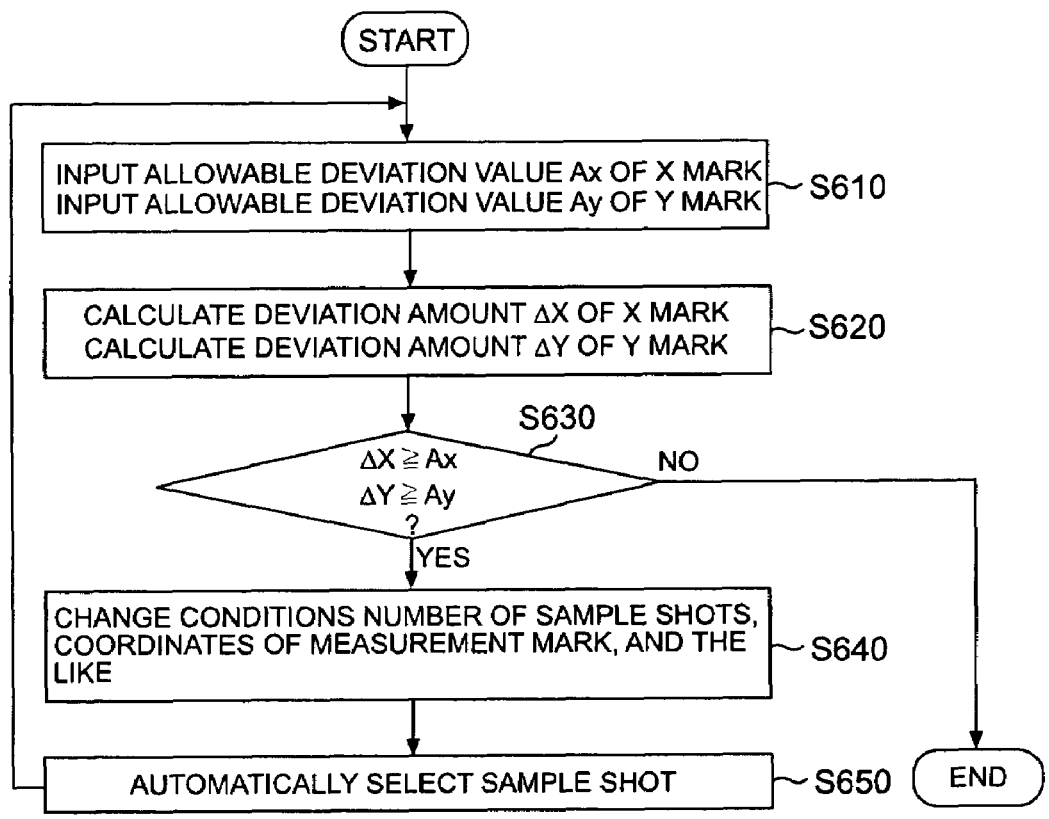
FIG. 6 is a flow chart for determining sample shot selection.

In the third stage, whether the measurement mark position coordinates of the sample shot selected in the second step is effective is checked. As shown in FIG. 6, first, an allowable deviation amount of the measurement mark position is input as Ax and Ay in accordance with a necessary precision (S610). Deviations of the measurement mark coordinates of the sample shot selected in the second stage are calculated for the respective measurement marks based on the distances from the wafer center which are already calculated in the second stage (S620). These deviations are defined as ΔX and ΔY that satisfy:

$$\Delta X \geq Ax \quad (1)$$

$$\Delta Y \geq Ay \quad (2)$$

If the conditions (1) and (2) are satisfied (S630—YES), this state is determined as a sample shot abnormality, and the operator is prompted to change the conditions. The operator changes the number of sample shots and the coordinates of other measurement marks (S640), and performs sample shot selection again (S650).

If the allowable deviation amounts can be input for each measurement mark, it is effective in sample shot selection when the required precision differs between the X and Y directions.

If the conditions (1) and (2) are not satisfied (S630—NO), the process is ended.

Conventionally, the shot center and the measurement shot position are treated to be identical (a deviation of the measurement mark from the substrate center occurs, as shown in FIGS. 9 and 10). In contrast to this, as described above, since the measurement marks are arranged in the vicinities of positions at the equal distance from the wafer center, as shown in FIGS. 4 and 5, no deviation occurs. Therefore, a measurement error caused by the process, which occurs radially from the wafer center, does not adversely affect the overlay accuracy, and the precision is improved.

Selection of measurement marks at the equal distance from the wafer center has been described. Alternatively, the measurement marks may be selected in accordance with other conditions.

<Exposure Apparatus Incorporating Alignment Unit>

FIG. 11 is a view showing the schematic arrangement of an exposure apparatus incorporating the alignment unit described above. In this exposure apparatus, a master (reticle, mask) 221 held by a master stage 220 is illuminated by an illumination optical system 210. A pattern on the master 221 is projected onto a substrate (wafer) 241 on a substrate stage (wafer stage) 240 through a projection optical system 230, thereby exposing the substrate 241. The alignment unit is adopted in alignment of the master 221 and substrate 241, and the alignment process is performed.

In this manner, with the exposure apparatus incorporating the alignment unit according to the present invention, alignment of the master and substrate can be performed at high precision, so the exposure performance of the exposure apparatus can be improved.

<Device Manufacturing Method Using Exposure Apparatus>

Figure 7:
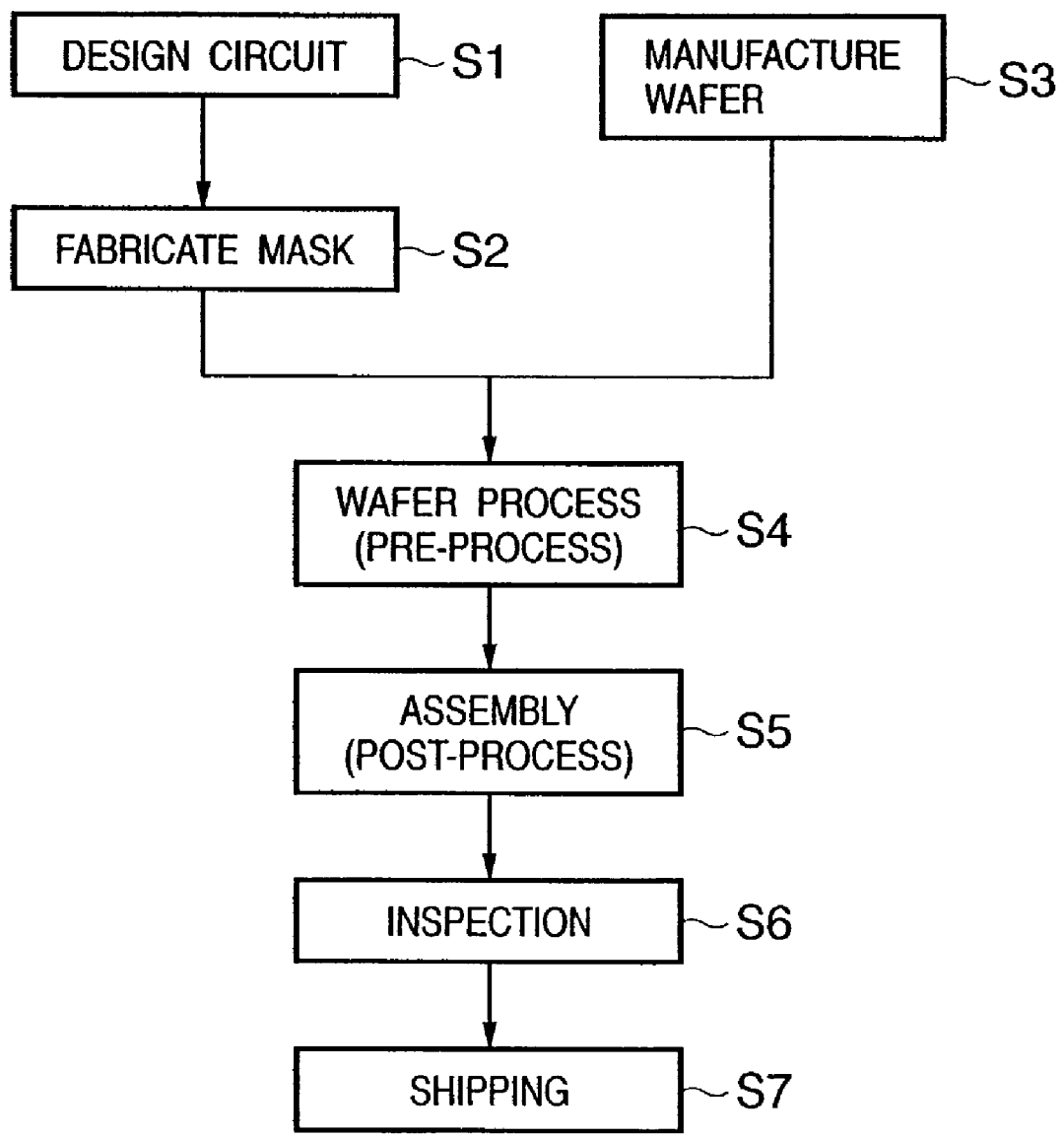
FIG. 7 is a flow chart showing a semiconductor device manufacturing process.

An embodiment of a device manufacturing method using an exposure apparatus to which the alignment unit as described above is applied will be described. FIG. 7 shows the manufacturing flow of a semiconductor device (e.g., a semiconductor chip such as an IC or LSI, a liquid crystal panel, a CCD, a thin film magnetic head, a micromachine, and the like). In step S1 (design circuit), a device pattern is designed. In step S2 (fabricate mask), a mask as a master on which the designed pattern is formed is fabricated. In step S3 (manufacture wafer), a wafer is manufactured by using a material such as silicon. In step S4 (wafer process), called a pre-process, an actual circuit is formed on the wafer by lithography using the prepared mask and wafer. In step S5 (assembly), called a post-process, a semiconductor chip is formed by using the wafer fabricated in step S4, and includes processes such as an assembly process (dicing and bonding) and a packaging process (chip encapsulation). In step S6 (inspection), inspections such as the operation confirmation test and durability test of the semiconductor device manufactured in step S5 are conducted. The semiconductor device is completed through these steps, and is shipped (step S7).

Figure 8:
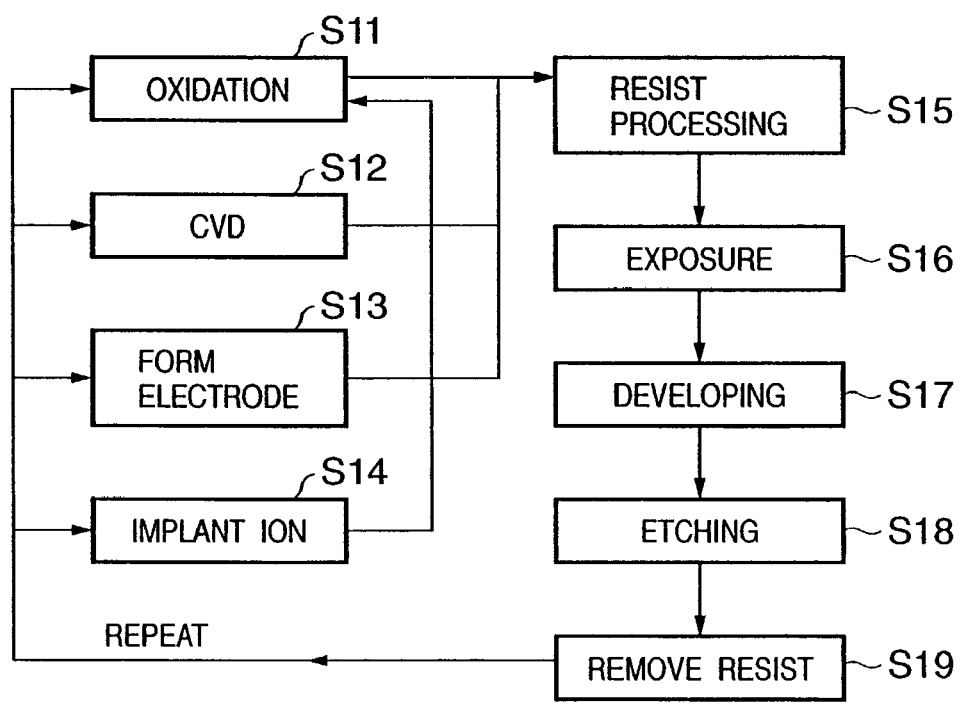
FIG. 8 is a detailed flow chart of the wafer process of FIG. 7.

FIG. 8 shows the detailed flow of the above wafer process. In step S11 (oxidation), the surface of the wafer is oxidized. In step S12 (CVD), an insulating film is formed on the wafer surface. In step S13 (form electrode), an electrode is formed on the wafer by vapor deposition. In step S14 (implant ion), ions are implanted in the wafer. In step S15 (resist processing), a photosensitive agent is applied to the wafer. In step S16 (exposure), the above-mentioned exposure apparatus or method exposes the circuit pattern of the mask to the wafer. In step S17 (developing), the exposed wafer is developed. In step S18 (etching), the resist is etched except for the developed resist image. In step S19 (remove resist), an unnecessary resist after etching is removed. These steps are repeated to form multiple circuit patterns on the wafer.

According to this embodiment, in the repeated processes, a high overlay accuracy can be obtained during exposure (step S116), as described above, so the semiconductor device manufacturing efficiency can be improved.

As has been described above, according to the present invention, high-precision overlaying, which is not adversely influenced by the manufacturing process, can be performed. Since the overlaying operation is not adversely affected by the manufacturing process, the shift component of the overlaying operation in the process condition confirming operation performed at the beginning of a batch process (e.g., a group of substrates that are processed continuously at once under the same process conditions) becomes stable. Hence, the process condition confirming operation can be reduced or eliminated, thereby improving the productivity.

As many apparently widely different embodiments of the present invention can be made without departing from the spirit and scope thereof, it is to be understood that the invention is not limited to the specific embodiments thereof except as defined in the claims.

What is claimed is:

1. A method of detecting positions of alignment marks formed on a substrate and moving the substrate based on the detected positions, executed by an exposure apparatus exposing the moved substrate to light via a reticle, said method comprising the steps of:
   calculating a deviation of a distance between a designed position of an alignment mark formed on the substrate and a center position of the substrate, with respect to each of a plurality of alignment marks formed on the substrate;
   selecting the plurality of alignment marks as alignment marks to be detected, if the deviation is less than a threshold with respect to each of the plurality of alignment marks;
   detecting each position of the plurality of alignment marks selected in said selecting step; and
   moving the substrate based on information of the positions detected in said detecting step.

2. A method according to claim 1, wherein said selecting step includes a step of comparing the deviations with the threshold.

3. A method according to claim 2, further comprising a step of prompting a change in condition for selecting alignment marks, based on a comparison performed in said comparing step.

4. A method according to claim 1, wherein the plurality of alignment marks include an alignment mark for both of x-direction alignment and y-direction alignment.

5. A method according to claim 1, wherein the plurality of alignment marks include an alignment mark for x-direction alignment and an alignment mark for y-direction alignment.

6. A method according to claim 5, wherein said selecting step selects one of the alignment mark for x-direction alignment and the alignment mark for y-direction alignment in a shot region.

7. A method according to claim 5, wherein said selecting step selects the alignment mark for x-direction alignment and the alignment mark for y-direction alignment in pairs from each of a plurality of shot regions.

8. A method according to claim 7, wherein said selecting step selects the alignment marks in pairs based on a representative position calculated from the designed positions of the alignment marks in pairs.

9. An exposure apparatus for moving a substrate based on detected positions of alignment marks selected from alignment marks formed on the substrate and exposing the moved substrate to light via a reticle, said apparatus comprising:
   a controller configured to calculate a deviation of a distance between a designed position of an alignment mark formed on the substrate and a center position of the substrate, with respect to each of a plurality of alignment marks formed on the substrate, and to select the plurality of alignment marks as alignment marks to be detected, if the deviation is less than a threshold with respect to each of the plurality of alignment marks; and
   a detector configured to detect a position of each of the selected alignment marks.

10. A method of manufacturing a device, said method comprising:
   a step of exposing a substrate to light via a reticle using an exposure apparatus for moving the substrate based on detected positions of alignment marks selected from alignment marks formed on the substrate and exposing the moved substrate to light;

a step of developing the exposed substrate; and a step of processing the developed substrate to manufacture the device, wherein the exposure apparatus includes:

(i) a controller configured to calculate a deviation of a distance between a designed position of an alignment mark formed on the substrate and a center position of the substrate, with respect to each of a plurality of alignment marks formed on the substrate, and to select the plurality of alignment marks as alignment marks to be detected, if the deviation is less than a threshold with respect to each of the plurality of alignment marks; and (ii) a detector configured to detect a position of each of the selected alignment marks.

* * * * *